(12) United States Patent
Hack et al.

(10) Patent No.: US 8,969,116 B2
(45) Date of Patent: Mar. 3, 2015

(54) SELECTIVE OLED VAPOR DEPOSITION USING ELECTRIC CHARGES

(71) Applicant: Universal Display Corporation, Ewing, NJ (US)

(72) Inventors: Michael Hack, Ewing, NJ (US); Julia J. Brown, Yardley, PA (US); Ho Kyoon Chung, Seoul (KR)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/745,036

(22) Filed: Jan. 18, 2013

(65) Prior Publication Data

US 2013/0189808 A1 Jul. 25, 2013

Related U.S. Application Data

(60) Provisional application No. 61/589,487, filed on Jan. 23, 2012.

(51) Int. Cl.
| | | |
|---|---|---|
| *H01L 51/56* | (2006.01) | |
| *H01L 51/00* | (2006.01) | |
| *C23C 14/04* | (2006.01) | |
| *C23C 14/12* | (2006.01) | |

(52) U.S. Cl.
CPC ............ *H01L 51/56* (2013.01); *H01L 51/0003* (2013.01); *C23C 14/04* (2013.01); *C23C 14/12* (2013.01)
USPC .......................................................... 438/46

(58) Field of Classification Search
None
See application file for complete search history.

(56) References Cited

U.S. PATENT DOCUMENTS

| | | | |
|---|---|---|---|
| 4,769,292 A | 9/1988 | Tang et al. | |
| 5,247,190 A | 9/1993 | Friend et al. | |
| 5,703,436 A | 12/1997 | Forrest et al. | |
| 5,707,745 A | 1/1998 | Forrest et al. | |
| 5,834,893 A | 11/1998 | Bulovic et al. | |
| 5,844,363 A | 12/1998 | Gu et al. | |
| 6,013,982 A | 1/2000 | Thompson et al. | |
| 6,087,196 A | 7/2000 | Sturm et al. | |
| 6,091,195 A | 7/2000 | Forrest et al. | |
| 6,097,147 A | 8/2000 | Baldo et al. | |
| 6,294,398 B1 | 9/2001 | Kim et al. | |

(Continued)

FOREIGN PATENT DOCUMENTS

| | | |
|---|---|---|
| WO | 2008057394 | 5/2008 |
| WO | 2010011390 | 1/2010 |

OTHER PUBLICATIONS

Forrest, Stehphen R., The Path to Ubiquitous and Low-cost Organic Electronic appliances on Plastic,Apr. 29, 2004, pp. 911-918.*

(Continued)

*Primary Examiner* — Seahvosh Nikmanesh
(74) *Attorney, Agent, or Firm* — Morris & Kamlay LLP

(57) ABSTRACT

A selective organic emissive material deposition technique is disclosed. A charged organic emissive material may be mixed with a carrier gas and ejected towards a charged intended area of a substrate. The charge for the emissive material may be such that the organic emissive material is attracted to the charged intended area of the substrate and, accordingly, deposited selectively over the charged intended area of the substrate. Additionally, surrounding unintended areas of the substrate may be charged such that the charged organic emissive material is repelled by the unintended areas.

18 Claims, 4 Drawing Sheets

(56) References Cited

U.S. PATENT DOCUMENTS

| | | |
|---|---|---|
| 6,303,238 B1 | 10/2001 | Thompson et al. |
| 6,337,102 B1 | 1/2002 | Forrest et al. |
| 6,468,819 B1 | 10/2002 | Kim et al. |
| 7,279,704 B2 | 10/2007 | Walters et al. |
| 7,431,968 B1 | 10/2008 | Shtein et al. |
| 7,968,146 B2 | 6/2011 | Wagner et al. |
| 2003/0230980 A1 | 12/2003 | Forrest et al. |
| 2004/0174116 A1 | 9/2004 | Lu et al. |

OTHER PUBLICATIONS

Yudistira et al., Flight behavior of charged droplets in electrohydrodynamic inkjet printing, Jan. 14, 2010, pp. 1-3.*

Baldo et al.,"Highly efficient phosphorescent emission from organic electroluminescent devices", Nature, vol. 395, pp. 151-154, 1998.

Baldo et al.,"Very high-efficiency green organic light-emitting devices based on electrophosphorescence", Applied Physics Letter, vol. 75, No. 1, pp. 4-6, 1999.

* cited by examiner

SELECTIVE OLED VAPOR DEPOSITION USING ELECTRIC CHARGES

PRIORITY

This application claims the benefit of U.S. Provisional Application No. 61/589,487, filed Jan. 23, 2012.

The claimed invention was made by, on behalf of, and/or in connection with one or more of the following parties to a joint university corporation research agreement: Regents of the University of Michigan, Princeton University, The University of Southern California, and the Universal Display Corporation. The agreement was in effect on and before the date the claimed invention was made, and the claimed invention was made as a result of activities undertaken within the scope of the agreement.

FIELD OF THE INVENTION

The present invention relates to light emitting devices and, more specifically, to OLEDs and method of fabricating OLEDs using deposition techniques in which molecules to be deposited are ejected onto a charged portion of a substrate.

BACKGROUND

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine)iridium, denoted Ir(ppy)3, which has the following structure:

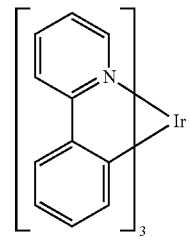

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

SUMMARY OF THE INVENTION

According to aspects of the disclosed subject matter, a selective OLED deposition technique is provided that includes applying a charge to at least a portion of a mixture that contains an organic emissive material and a carrier gas. The charge may be applied to either the organic emissive material and/or the carrier gas, and may be applied to the carrier gas before or after the organic emissive material is introduced to the carrier gas to form the first mixture. Additionally, the technique includes applying a second charge to a portion of a substrate, which is of the opposite sign to the charge applied to the mixture, and directing the first organic emissive material towards the substrate. A third charge having the same sign as the charge applied to the mixture may be applied to a nearby region of the substrate or, alternatively, the third charge may be the opposite sign as the charge applied to the mixture but with a different magnitude than the second charge. The substrate may contain an active matrix backplane and/or a plurality of electrodes, and the initial region of the substrate may contain at least one, but not all, of the plurality of electrodes. A third charge may be applied to at least a portion of a different mixture, which contains another organic emissive material and carrier gas. A fourth charge also may be applied to a region of the substrate that is distinct from the region over which the original organic emissive material is deposited. The fourth charge may be opposite in sign to the third charge and the organic emissive material may be directed towards the substrate. The emissive material may have a peak emission wavelength different from that of the original emissive material; each carrier gas may contain the same or different materials. Additionally, the organic emissive material may form a patterned layer on the substrate.

According to aspects of the disclosed subject matter, an implementation may contain a carrier gas source, an organic emissive material source and a delivery system containing a feed conduit, a mixing region, and a nozzle, at least one of which apply a charge to a portion of a mixture, which contains the organic emissive material and the carrier gas, and, eject the charged mixture toward a substrate from the nozzle. A substrate mount may be configured to apply a second charge to the substrate, the second charge being of opposite sign to the first charge. A second nozzle may be configured to apply another charge to a second mixture containing a second organic emissive material and a second carrier gas and may eject the charged second mixture toward the substrate from the second nozzle. A nozzle block may have a set of nozzles to eject organic emissive material at a given time, and a second nozzle block may have a second set of nozzles to eject organic emissive material at a second time and/or at a second location, different from the first set of nozzles. A data line may apply a charge to a first set of electrodes and a second data line may apply a different charge to a second set of electrodes. The charges may be the same sign and a charge may be applied to the either data line based on the active nozzle block. Nozzles in the nozzle block may eject an organic emissive layer material over a first substrate block at a given time and second substrate block at a different time and nozzles in the second nozzle block may eject an organic emissive layer over the first substrate block at the second time. Nozzles in the nozzle block may eject an organic emissive layer material over a first substrate location at a first time and nozzles in the second nozzle block may eject an organic emissive layer over a second substrate location at the same first time. The organic emissive material may form a patterned layer on the substrate.

According to aspects of the disclosed subject matter, a first charge may be applied to a carrier gas and, subsequently, an organic emissive material may be introduced to the carrier gas. A second charge may be applied to a first portion of a substrate, the second charge being of opposite sign to the first charge. The carrier gas and the organic emissive material may be directed toward the substrate.

DETAILED DESCRIPTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
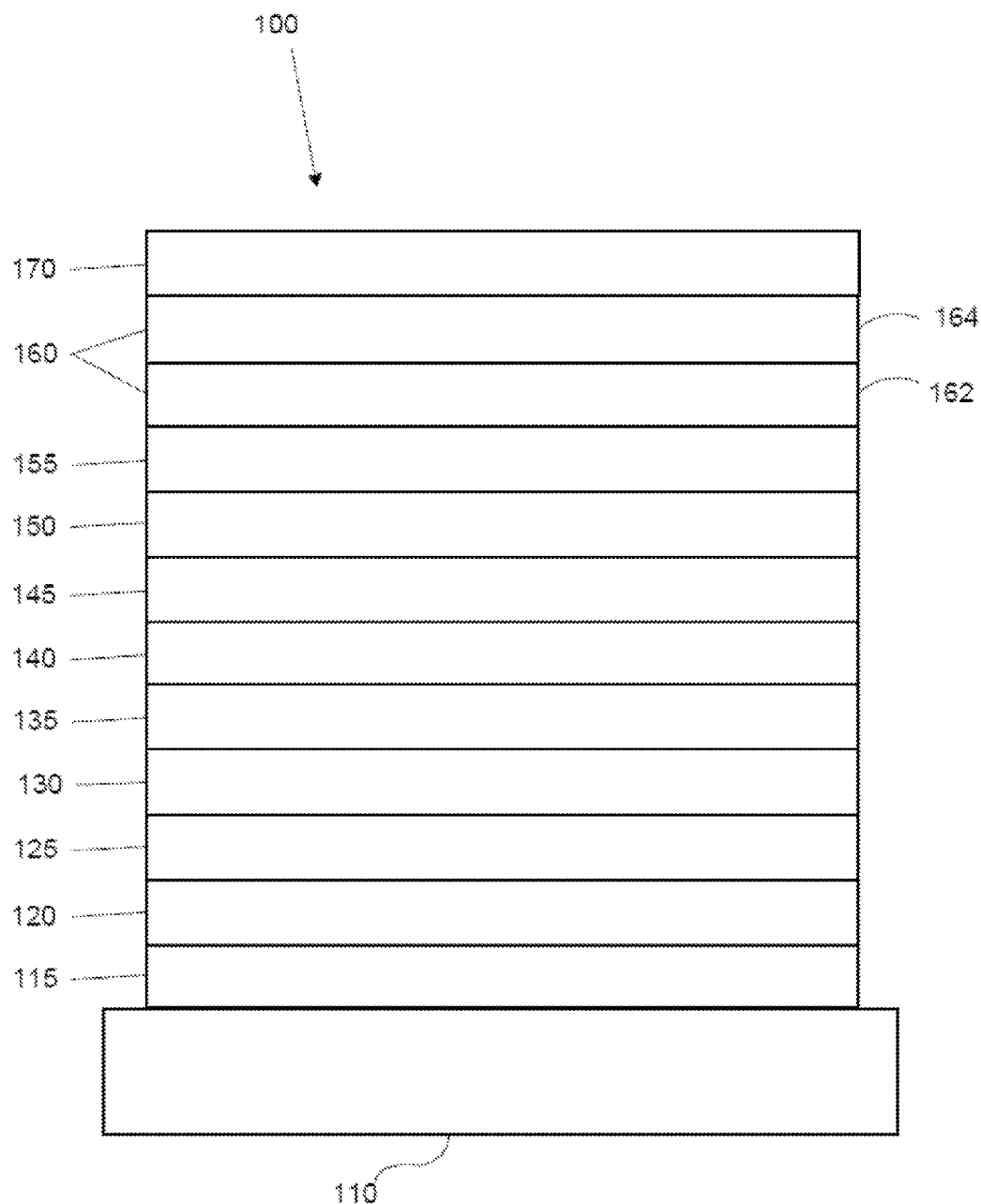
FIG. 1 shows an example organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, a cathode 160, and a barrier layer 170. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
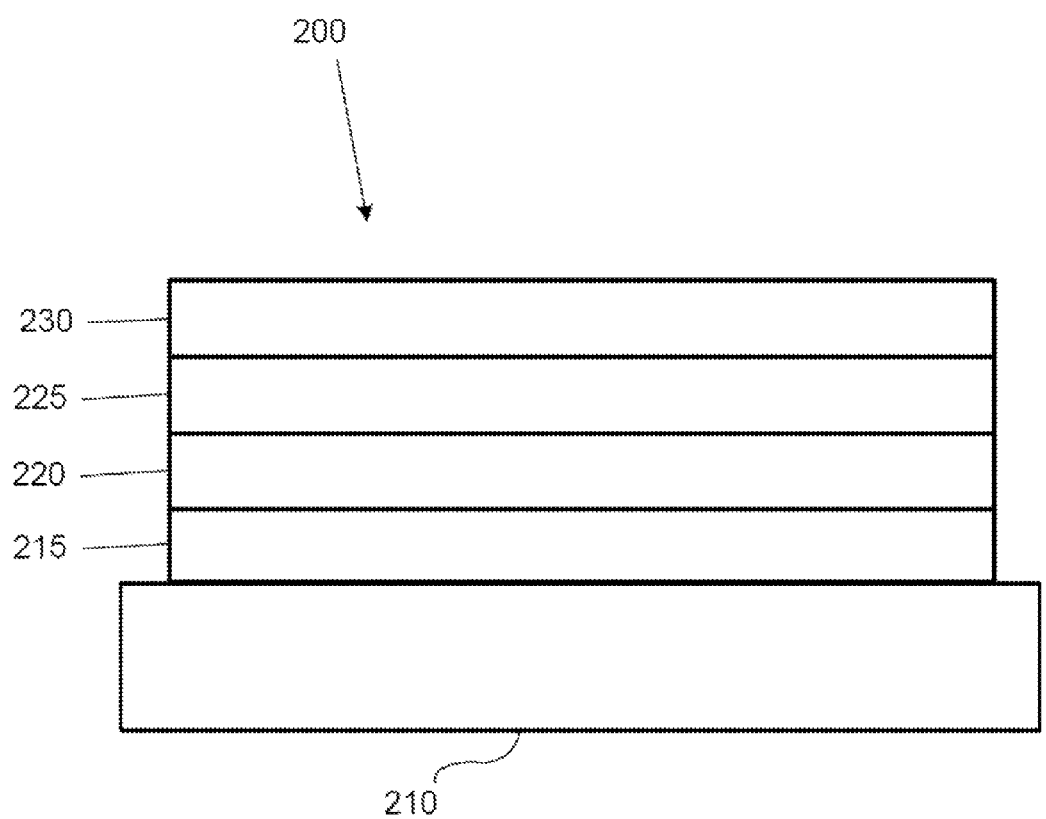
FIG. 2 shows an example inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used. Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. Pat. No. 7,431,968, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink jet and OVJD. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution proccessability than those having symmetric structures, because asymmetric materials may have a lower tendency to recrystallize. Dendrimer substituents may be used to enhance the ability of small molecules to undergo solution processing.

Devices fabricated in accordance with embodiments of the present invention may further optionally comprise a barrier layer. One purpose of the barrier layer is to protect the electrodes and organic layers from damaging exposure to harmful species in the environment including moisture, vapor and/or gases, etc. The barrier layer may be deposited over, under or next to a substrate, an electrode, or over any other parts of a device including an edge. The barrier layer may comprise a single layer, or multiple layers. The barrier layer may be formed by various known chemical vapor deposition techniques and may include compositions having a single phase as well as compositions having multiple phases. Any suitable material or combination of materials may be used for the barrier layer. The barrier layer may incorporate an inorganic or an organic compound or both. The preferred barrier layer comprises a mixture of a polymeric material and a non-polymeric material as described in U.S. Pat. No. 7,968,146, PCT Pat. Application Nos. PCT/US2007/023098 and PCT/US2009/042829, which are herein incorporated by reference in their entireties. To be considered a "mixture", the aforesaid polymeric and non-polymeric materials comprising the barrier layer should be deposited under the same reaction conditions and/or at the same time. The weight ratio of polymeric to non-polymeric material may be in the range of 95:5 to 5:95. The polymeric material and the non-polymeric material may be created from the same precursor material. In one example, the mixture of a polymeric material and a non-polymeric material consists essentially of polymeric silicon and inorganic silicon.

Devices fabricated in accordance with embodiments of the invention may be incorporated into a wide variety of consumer products, including flat panel displays, computer monitors, medical monitors, televisions, billboards, lights for interior or exterior illumination and/or signaling, color tunable or color temperature tunable lighting sources, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Devices fabricated in accordance with embodiments of the present invention may have a first organic light emitting device, a second organic light emitting device, a third organic light emitting device, and a fourth organic light emitting device, such as corresponding to sub-pixels within a pixel of a display. A preferred use of the device is in an active matrix organic light emitting display, in which the shortcomings of blue OLEDs may be a limiting factor.

The first organic light emitting device may emit red light, the second organic light emitting device may emit green light, the third organic light emitting device may emit light blue light, and the fourth organic light emitting device may emit deep blue light. The peak emissive wavelength of the third and fourth devices can differ by at least 4 nm. As used herein, "red" means having a peak wavelength in the visible spectrum of 600-700 nm, "green" means having a peak wavelength in the visible spectrum of 500-600 nm, "light blue" means having a peak wavelength in the visible spectrum of 470-500 nm, and "deep blue" means having a peak wavelength in the visible spectrum of 400-470 nm. In some configurations disclosed herein where a distinction between light and deep blue is not required, "blue" means having a peak wavelength in the visible spectrum of 400-500 nm. Preferred ranges include a peak wavelength in the visible spectrum of 610-640 nm for red and 510-550 nm for green.

To add more specificity to the wavelength-based definitions, "light blue" may be further defined, in addition to having a peak wavelength in the visible spectrum of 470-500 nm that is at least 4 nm greater than that of a deep blue OLED in the same device, and preferably having a CIE x-coordinate less than 0.2 and a CIE y-coordinate less than 0.5, and "deep blue" may be further defined, in addition to having a peak wavelength in the visible spectrum of 400-470 nm, as preferably having a CIE y-coordinate less than 0.15 and preferably less than 0.1, and the difference between the two may be further defined such that the CIE coordinates of light emitted by the third organic light emitting device and the CIE coordinates of light emitted by the fourth organic light emitting device are sufficiently different that the difference in the CIE x-coordinates plus the difference in the CIE y-coordinates is at least 0.01. As defined herein, the peak wavelength is the primary characteristic that defines light and deep blue, and the CIE coordinates are preferred.

A device or pixel having four organic light emitting devices, one red, one green, one light blue and one deep blue, may be used to render any color inside the shape defined by the CIE coordinates of the light emitted by the devices on a CIE chromaticity diagram.

Similarly, an embodiment of the invention may include pixels having red, green, blue, and infra-red sub-pixels, where an infra-red sub-pixel has a peak emission wavelength in the range of 800-2000 nm. Such a device may be useful when a user wishes to avoid detection.

Devices fabricated in accordance with embodiments of the invention may be incorporated into a wide variety of consumer products, including flat panel displays, computer monitors, medical monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, or a sign. Various control mechanisms may be used to control devices fabricated in accordance with the present invention, including passive matrix and active matrix.

Organic light emitting devices produced using conventional techniques may not provide a high level of selectivity when depositing organic material onto a substrate. For example, producing an organic light emitting device using a vacuum thermal evaporation (VTE) technique can result in limited control over the amount of material deposited over specific electrodes or the concentration of host or dopant in the material. Further, targeting a specific electrode for deposition of material may not be effective, as there can be inherent spreading of the material past the target deposition zone (e.g., a sub pixel).

According to embodiments of the disclosed subject matter, organic material can be deposited on a portion of a substrate in a selective manner. Organic material to be deposited may be ejected from a nozzle towards a substrate. The deposition process may utilize a charged mixture that includes the organic molecules to be ejected towards the substrate. The organic molecules may be deposited onto an intended electrode patterned onto a substrate and the electrical bias of the intended electrode may be adjusted such that it attracts the charged mixture. Additionally, the electrical bias of one or more unintended electrodes surrounding the intended electrode may be adjusted such that they repel or do not attract the charged mixture.

According to embodiments of the disclosed subject matter, organic material may be directed towards an area of a substrate; the area of the substrate may be an electrode and may form a sub-pixel with the application of organic material onto the electrode. As an example, the sub-pixel may be a red, green, light blue, dark blue, or an infra-red sub-pixel. A substrate may contain a plurality of pixels and each pixel may contain one or more sub-pixels. The sub-pixels may be arranged such that they are in close proximity to one or more other sub-pixels. Accordingly, it can be beneficial to deposit organic material on a sub-pixel, the organic material corresponding specifically to that sub-pixel. For example, organic material corresponding to a green sub-pixel may be deposited only on a sub-pixel corresponding to a green sub-pixel. Alternatively, organic material corresponding to a red sub-pixel may be deposited only on a sub-pixel corresponding to a red sub-pixel.

Figure 3:
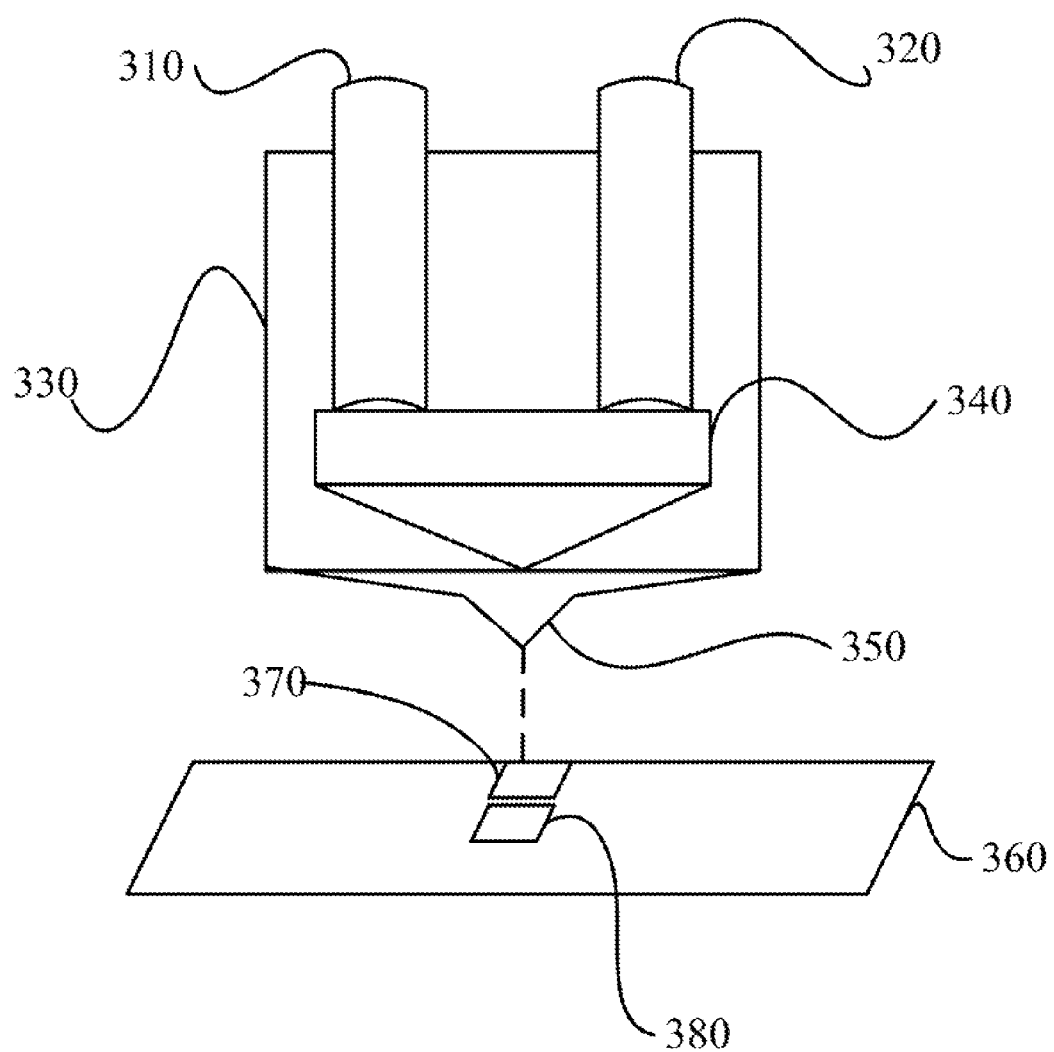
FIG. 3 shows an example deposition delivery arrangement according to an implementation of the disclosed subject matter.

Organic material may be directed towards an area of a substrate via a nozzle. As used herein, a nozzle refers to any appropriate directional conduit that allows deposition onto a targeted area. The nozzle may be, but is not limited to, a directional hole, pipe, tube, or the like, and may be convergent and configured to release the organic material or mixture in a particular manner. FIG. 3 shows an example deposition delivery arrangement. As shown in FIG. 3, a nozzle 350 may direct a mixture containing organic material towards a portion of a substrate, such as an electrode 370. In this example, the nozzle can be convergent such that matter ejected from the nozzle is collimated and/or directed towards the direction in which the nozzle head converges, such as towards the electrode 370. According to embodiments of the disclosed subject matter, the nozzle may move relative to the electrode 370 such that it is configured to eject material towards electrode 380 after moving relative to the substrate. Alternatively, the nozzle may remain stationary and the substrate may move relative to the nozzle such that the nozzle is configured to eject material towards electrode 380.

According to embodiments of the disclosed subject matter, a charged mixture may be ejected from a nozzle towards a substrate. The mixture may be charged such that it has either a positive or a negative charge at a particular magnitude. For example, the charged mixture may have a positive charge such that it is at +500V relative to a common ground. The +500V charge may be measured and described relative to a common ground, which may be earth or any other applicable common voltage in the system. Thus, as used herein, a material or surface may be described as having a positive or negative charge by indicating the resulting voltage of the material or surface relative to the common ground or other potential surface which is set at zero potential, such as +500V or −500V. Although the voltage values used herein have a magnitude of 500, it will be understood that, in practice, the voltages applied to any part of the mixture may have any appropriate magnitude such that it may vary from under 5V to over 3 kV.

Additionally, the portion of the substrate towards which the mixture is directed may also be charged. The charge for the portion of the substrate may be opposite from the charge of the mixture. The magnitude for the oppositely charged portion of the substrate may be equal to the magnitude of the mixture, or may be any other value that causes the charged mixture to be electrically attracted to the intended portion of the substrate. Continuing the example, an electrode on the substrate towards which the +500V mixture is directed may be charged and have a −500V charge relative to the same common ground. Accordingly, the charged mixture is attracted to the oppositely charged electrode, causing the mixture to deposit over the electrode. Notably, the charged mixture is more likely to be directed toward, and thus result in a deposition on, the charged portion of the substrate, such as the charged electrode in the illustrated example. Thus this arrangement may be more likely to result in selective deposition of organic material in the mixture than conventional or other arrangements that do not apply a charge to the mixture and/or the substrate on which a material in the mixture is to be deposited.

According to embodiments of the disclosed subject matter, unintended portions of the substrate proximally surrounding the portion of the substrate towards which a charged mixture is directed may be charged such that the charged mixture is repelled by, or not attracted to, the unintended portions. For example, a charged mixture may be directed towards a green sub-pixel area of a pixel containing electrodes corresponding to green, red, and blue sub-pixels. The charged mixture may be given a positive charge and the green sub-pixel area may be at a negative charge. Additionally or alternatively, the red and blue sub-pixel areas may be given a positive charge. This will repel the positively-charged mixture away from the unintended red and blue portions of the pixel, and attract the mixture towards the green portion of the pixel.

Alternatively or in addition, according to embodiments of the disclosed subject matter, the charge sign for the intended portion of the substrate towards which the mixture is directed towards may be the same as the sign of the charged mixture. Here, the charge sign for the unintended portion of the substrate may also be the same as the charged mixture; however, the magnitude of the charged unintended portion of the substrate may be higher than the magnitude of the charge for the intended portion of the substrate. Accordingly, the charged mixture may be repelled more strongly from the unintended portion of the substrate based on the higher magnitude, and thus deposit on the intended portion of the substrate due to the less repellent lower charge. For example, a charged mixture may be directed towards a green sub-pixel area of a pixel containing areas for green, red, and blue sub-pixels. The charged mixture may be at a +500V charge and the green sub-pixel area may be at a +100V charge. Additionally, the red and blue sub-pixel areas may be at a +500V charge, effectively repelling the positively charged mixture away from the unintended red and blue portions of the pixel and "attracting" the mixture towards the green portion of the pixel. Similarly, the intended portion of the substrate may be at an equal potential to the common ground, i.e., at 0V, and the unintended portion of the substrate may have the same charge sign as the charged mixture and any magnitude greater than zero. Accordingly, the same effect of repelling the mixture away from the unintended portion of the substrate and attracting the mixture towards the intended portion of the substrate may be achieved.

A portion of a substrate, such as an electrode, may be charged using an active matrix backplane. An active matrix backplane may allow the bias for each electrode on a substrate to be controlled individually and, accordingly, a desired charge may be applied to both intended and unintended electrodes. For example, a mixture with a +500V charge may be directed toward an intended sub-pixel. The intended sub-pixel may be charged to −500V via the active matrix, and unintended sub-pixels surrounding the intended sub-pixel may be charged to +500V via the active matrix. Column or row drives may apply uniform biases to an entire row or column of electrodes. For example, an entire row of electrodes may be driven such that each electrode corresponding to a red sub-pixel carries the same charge. Alternatively, the data lines for electrodes corresponding to the same type of sub-pixel (e.g., red, green, light blue, etc.) may be joined such that each electrode corresponding to a type of sub-pixel carries the same charge as each other electrode corresponding to that type of sub-pixel. For example, the data lines for all electrodes corresponding to a red sub-pixel may be joined such that all electrodes corresponding to a red sub-pixel are charged in the same manner. The joined data lines may be un-joined after the organic disposition by removing or electrically disconnecting any shorting bars joining the data lines.

According to embodiments of the disclosed subject matter, the charged mixture may contain a carrier gas to transport the organic material from the nozzle to the substrate for deposition. For example, the carrier gas may be a nitrogen based gas or an inert gas such as argon. The carrier gas may be mixed with the organic material prior to the mixture being ejected from the nozzle. A carrier gas may be charged, causing a mixture of the organic material and the carrier gas to be charged. The carrier gas may be charged prior to entering the deposition delivery arrangement in an external area separate from the deposition deliver arrangement. Alternatively, the carrier gas may be charged in a delivery pipe within the deposition delivery arrangement, the delivery pipe guiding the carrier gas to a mixing chamber. Alternatively, the carrier gas and the organic material may be charged together in a mixing chamber where the carrier gas is mixed with the organic material.

Alternatively, the organic material may be charged, causing the mixture of the organic material and the carrier gas to be charged. A charged organic material may be charged under conditions that allow the material to maintain its properties. For example, if a property of an organic material changes if the charge rises above a threshold magnitude, then the organic material may be charged such that the magnitude for the charge is maintained below the threshold magnitude. The organic material may be charged prior to entering the deposition delivery arrangement in an external area separate from the deposition deliver arrangement. Alternatively, the organic material may be charged in a delivery pipe within the deposition delivery arrangement, the delivery pipe guiding the organic material to a mixing chamber.

FIG. 3 shows an illustrative example of the deposition delivery arrangement. Organic material may be delivered to a mixing chamber 340 via a first delivery pipe 310. A carrier gas may be delivered to the mixing chamber 340 via a second delivery pipe 320. Either the organic material or the carrier gas may be charged prior to reaching the respective delivery pipe, within the respective delivery pipe, or one or both may be charged within the mixing chamber 340. The charged mixture may be ejected through a nozzle 350 towards a substrate 360 and, more specifically, towards a part of the substrate, such as a sub-pixel 370. The sub-pixel 370 can have a charge opposite to the charged mixture, attracting the charged mixture towards the sub-pixel 370 as previously described. Additionally, one or more adjacent sub-pixels 380 can have a charge the same as the charged mixture, repelling the charged mixture away from the adjacent sub-pixel 380 as previously described.

According to embodiments of the disclosed subject matter, organic emissive material may form a patterned layer on the substrate using one or more nozzle blocks. As used herein, a nozzle block refers to a set of one or more nozzles, each of which is configured to eject a type of mixture. The mixture ejected from each nozzle in a nozzle block may be the same or similar, such that it contains organic material corresponding to a type of sub-pixel. As a specific example, the mixture ejected from each nozzle in nozzle block A can contain organic material corresponding to a green sub-pixel and the mixture ejected from each nozzle in nozzle bock B can contain organic material corresponding to a red sub-pixel. As used herein, a substrate block refers to a portion of a substrate which may contain multiple electrodes. As an example, a substrate block may be a row or column of electrodes, each electrode corresponding to one or more sub-pixels.

A nozzle block may eject a mixture over a substrate block such that at least a portion of the nozzles in the nozzle bock eject mixture towards at least a portion of the substrate block. Each nozzle in the nozzle block may eject mixture towards a distinct portion of the substrate block, such as an electrode. The electrodes on the substrate block intended to receive the mixture from the nozzle bock may be charged such that the mixture is attracted towards those electrodes, according to techniques disclosed herein. Electrodes on the substrate block not intended to receive the mixture from the nozzle block may be charged such that the mixture is repelled away from those electrodes, according to techniques disclosed herein. The electrodes on the substrate block may be charged such that all electrodes corresponding to the same sub-pixel type are joined and, thus, carry the same charge.

In some configurations, a specific pixel compensation circuit may not provide both positive and negative voltages to one or more sub-pixel electrodes Such a configuration may prevent some of the selective schemes disclosed herein from being utilized. In an embodiment, the OLED current in each sub-pixel can be controlled by a TFT connected in series between the TFT and a power rail, which in turn may be connected to a substrate block. Accordingly, electrodes on a substrate block may be charged by utilizing the substrate block charge to charge the electrodes, such that the substrate block charge via the power rail is applied to select electrodes. The substrate block charge may be applied such that the intended electrodes attract a mixture ejected towards them and unintended electrodes repel a mixture ejected towards them. As an example, a substrate block with an inherent charge of +400V may have a +500V charged red mixture ejected towards it. Accordingly, electrodes in the substrate block not corresponding to red sub-pixels may receive the substrate block's +400V charge to repel the +500V charged red mixture. Alternatively, as another example, a substrate block with an inherent charge of +400V may have a −500V charged red mixture ejected towards it. Accordingly, electrodes in the substrate block corresponding to red sub-pixels may receive the substrate block's +400V charge to attract the −500V charged red mixture.

In some configurations the power rail voltage may alternate from positive to negative on a periodic basis, and the electrodes receiving the charge from the substrate block may change polarity accordingly. For example, at a first time a substrate block with an inherent charge of +500V via a power rail may have a −500V charged red mixture ejected towards it. Accordingly, electrodes in the substrate block corresponding to red sub-pixels may receive the substrate block's +500V charge to attract the −500V charged red mixture. At a second time the substrate block may have an inherent charge of −500V via the power rail as a result of the charge in the power rail changing. Accordingly, electrodes in the substrate block not corresponding to red sub-pixels may receive the substrate block's −500V charge to repel the −500V charged red mixture. In a configuration with multiple nozzle blocks, a nozzle block currently ejecting a mixture may be referred to as an "active" nozzle block. Charges to be applied to electrodes may be determined based on the active nozzle block. For example, an active nozzle block ejecting a red mixture may cause the electrodes in at least the substrate block under the active nozzle block to be charged such that the electrodes corresponding to red sub-pixels attract the mixture and, more specifically, the electrodes corresponding to red sub-pixels attract the mixture more strongly than other surrounding sub-pixels.

According to embodiments of the disclosed subject matter, a nozzle block may eject a mixture over a first substrate block at a first time, and then over a second substrate block at a subsequent time. The nozzle block may shift relative to the substrate block such that it is over the first block at the first time and over the second substrate block over the second time. Alternatively, the substrate may shift relative to the nozzle block such that the first substrate block is under the first nozzle block at the first time and the second substrate block is under the first nozzle block at the second time. For example, a nozzle block corresponding to a red mixture may eject a mixture over the respective electrodes in a first substrate block. Subsequently, the substrate may shift such that the first substrate block is no longer under the nozzle block, and a second substrate block may shift under the nozzle block and the nozzle block may eject a red mixture over the second substrate block.

According to embodiments of the disclosed subject matter, two or more nozzle blocks may eject a mixture over two or more substrate blocks such that a first nozzle block may eject a first mixture over a first substrate location at a first time, and a second nozzle block may eject a second mixture over a second substrate location at the first time. For example, a nozzle block corresponding to a red mixture may eject a mixture over the respective electrodes in a first substrate location and a nozzle block corresponding to a green mixture may eject a mixture over the respective electrodes in a second substrate location at the same time. The nozzle blocks may then shift or, alternatively, the substrate may shift such that the nozzle blocks eject their respective mixtures over different substrate blocks located in different locations.

Figure 4:
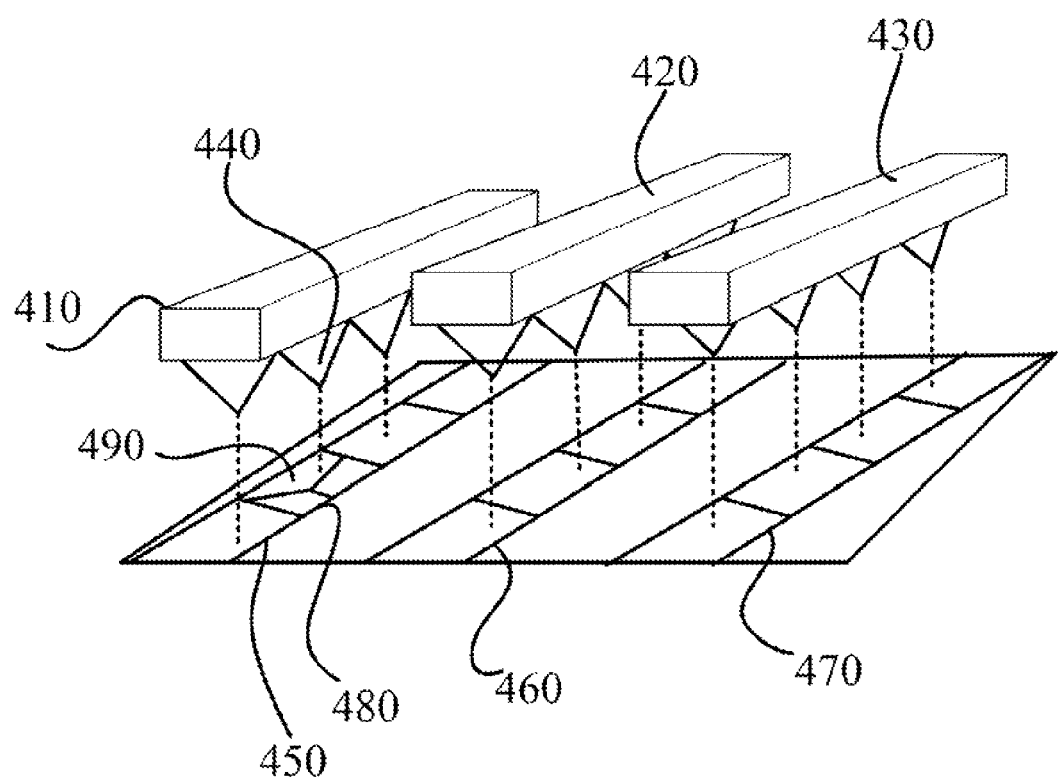
FIG. 4 shows an example nozzle block based deposition delivery arrangement according to an implementation of the disclosed subject matter.

FIG. 4 shows an illustrative example of a block based delivery system. Here, a three nozzle block configuration where nozzle blocks 410, 420, and 430 deposit mixtures over substrate blocks 450, 460, and 470 respectively. Nozzle block 410 may correspond to a red mixture, 420 to a green, and 430 to a blue. The nozzles in each nozzle block, such as nozzle 440, eject a +500 v charged mixture towards a pixel 480 and more specifically towards an electrode 490 corresponding to a sub-pixel. The sub-pixel 490 can be the sub-pixel intended to receive the mixture (e.g., red, green, or blue) being ejected by the nozzles in the nozzle block 410. The electrodes in each substrate block may be charged based on the mixture being deposited on the electrodes. For example, the electrodes in substrate block 450 corresponding to a red sub-pixel may have a −500V charge and the electrodes corresponding to a green or blue sub-pixel may have a +500V charge. Accordingly, the mixture ejected from nozzle block 410 can be attracted to the corresponding red electrodes, and repelled by the green and blue electrodes. At a subsequent time, according to the example, the substrate may shift such that substrate block 460 is under nozzle block 410 and substrate block 470 is under nozzle block 430. Accordingly, substrate block 460 and 470 may receive a mixture ejected from nozzles in nozzle block 410 and 420 respectively. Electrodes in the shifted substrate blocks may be charged based on the different mixture they intend to receive from the different nozzle block that they are under. For example, electrodes in substrate block 460 may be charged to receive the +500V charged red mixture from nozzle block 410 such that the electrodes corresponding to red sub-pixels have a −500V charge and the other electrodes have a +500V charge. Additionally, receiving the mixture after shifting can render pixels in substrate blocks 460 and 470 with at least two electrodes that are filled with organic material. Specifically, electrodes in substrate block 460 may receive a green mixture from nozzle block 420 prior to the shift, and a red mixture from nozzle block 420 after the shift.

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The invention claimed is:

1. A method comprising:
    applying a first electric charge having a magnitude of at least 5V to at least a portion of a first mixture, the first mixture comprising a first organic emissive material and a first carrier gas;
    applying a second electric charge having a magnitude of at least 5V to a first portion of a substrate, the second electrical charge being of opposite sign to the first electric charge; and
    directing the first organic emissive material toward the substrate.

2. The method of claim 1, wherein the first electric charge is applied to the first organic emissive material.

3. The method of claim 1, wherein the first electric charge is applied to the first carrier gas.

4. The method of claim 1, wherein the first electric charge is applied to the first carrier gas before the first organic emissive material is introduced to the first carrier gas to form the first mixture.

5. The method of claim 1, further comprising:
    applying a third electric charge to a second region of the substrate, the third electric charge being of the same sign as the first electric charge.

6. The method of claim 1, further comprising:
    applying a third electric charge to a second region of the substrate, the third electric charge being of the same sign as, but different magnitude than, the second electric charge.

7. The method of claim 1, wherein the substrate comprises a plurality of electrodes, and the first region of the substrate comprises at least one, but not all, of the plurality of electrodes.

8. The method of claim 7, wherein the substrate comprises an active matrix backplane.

9. The method of claim 7, wherein the substrate comprises a color tunable lighting panel.

10. The method of claim 1, further comprising:
    applying a third electric charge to at least a portion of a second mixture, the second mixture comprising a second organic emissive material and a second carrier gas;
    applying a fourth electric charge to a second region of the substrate, the second region being distinct from the first region, the fourth electric charge being of opposite sign to the third electric charge; and
    directing the second organic emissive material toward the substrate.

11. The method of claim 10, wherein the second emissive material has a peak emission wavelength different from a peak emission wavelength of the first emissive material.

12. The method of claim 10, wherein the second carrier gas comprises the same material as the first carrier gas.

13. The method of claim 1, wherein the organic emissive material forms a patterned layer on the substrate.

14. A method comprising:
applying a first electric charge having a magnitude of at least 5V to a carrier gas;
subsequent to applying the first electric charge, introducing an organic emissive material to the carrier gas;
applying a second electric charge having a magnitude of at least 5V to a first portion of a substrate, the second electric charge being of opposite sign to the first electric charge; and
directing the carrier gas and the organic emissive material toward the substrate.

15. The method of claim 1, wherein at least one of the first electric charge and the second electric charge has a magnitude of at least 100V.

16. A method comprising:
applying a first electric charge to at least a portion of a first mixture, the first mixture comprising a first organic emissive material and a first carrier gas;
applying a second electric charge of the same sign as the first electric charge to at least a portion of a second mixture, the second mixture comprising a second organic emissive material and a second carrier gas;
applying a third electric charge to a first portion of a substrate, the third electrical charge being of opposite sign to the first electric charge;
directing the first organic emissive material from a first nozzle toward the substrate; and
directing the second organic emissive material from a second nozzle toward the substrate.

17. The method of claim 16, further comprising:
applying a fourth electric charge of the same sign as the first electric charge to at least a portion of a third mixture, the third mixture comprising a third organic emissive material and a third carrier gas; and
directing the third organic emissive material from a third nozzle toward the substrate.

18. The method of claim 17, wherein the first, second, and third nozzles are disposed within a common nozzle block.

* * * * *